(12) United States Patent
Li et al.

(10) Patent No.: US 10,804,171 B2
(45) Date of Patent: Oct. 13, 2020

(54) SENSOR PACKAGING STRUCTURE AND MANUFACTURING METHOD THEREOF

(71) Applicant: MICROARRAY MICROELECTRONICS CORP., LTD, Suzhou (CN)

(72) Inventors: Yangyuan Li, Suzhou (CN); Shaobo Ding, Suzhou (CN)

(73) Assignee: MICROARRAY MICROELECTRONICS CORP., LTD., Suzhou, Jiangsu (CN)

( * ) Notice: Subject to any disclaimer, the term of this patent is extended or adjusted under 35 U.S.C. 154(b) by 0 days.

(21) Appl. No.: 15/781,069

(22) PCT Filed: Nov. 30, 2016

(86) PCT No.: PCT/CN2016/108039
§ 371 (c)(1),
(2) Date: Jun. 1, 2018

(87) PCT Pub. No.: WO2017/092677
PCT Pub. Date: Jun. 8, 2017

(65) Prior Publication Data
US 2018/0366381 A1     Dec. 20, 2018

(30) Foreign Application Priority Data

Dec. 4, 2015   (CN) .......................... 2015 1 0885822

(51) Int. Cl.
*H01L 23/053*     (2006.01)
*H01L 21/56*      (2006.01)
(Continued)

(52) U.S. Cl.
CPC .......... *H01L 23/053* (2013.01); *H01L 21/561* (2013.01); *H01L 23/3121* (2013.01);
(Continued)

(58) Field of Classification Search
None
See application file for complete search history.

(56) References Cited

U.S. PATENT DOCUMENTS

| 8,508,007 B2 * | 8/2013 | Nakashiba | H04N 5/2254 |
| | | | 257/428 |
| 8,810,021 B2 * | 8/2014 | Nakashiba | H01L 23/3128 |
| | | | 257/691 |
| 2003/0124773 A1 | 7/2003 | Hashimoto | |

FOREIGN PATENT DOCUMENTS

| CN | 101683966 A | 3/2010 |
| CN | 105046239 A | 11/2015 |
| CN | 105489588 A | 4/2016 |

OTHER PUBLICATIONS

International Search Report for PCT /CN2016/108039, dated Mar. 15, 2017, and its English translation provided by WIPO.
(Continued)

*Primary Examiner* — Bo B Jang
(74) *Attorney, Agent, or Firm* — Ladas & Parry, LLP (57) ABSTRACT

Disclosed in the present invention are a sensor packaging structure and a manufacturing method thereof. The sensor packaging structure includes a protection board, a circuit structure and a filling structure. A front surface of the circuit structure is connected to a first surface of the protection board. A second surface of the protection board is used as a sensing function surface. The filling structure is located on the outer periphery of the circuit structure and connected to the first surface of the protection board. The sensor packaging structure of the present invention uses the protection board as a protection layer of the functional circuit, which can effectively protect the functional circuit of the sensor. Meanwhile, the protection board is first connected to the (Continued)

circuit structure in the manufacturing method to avoid tolerance accumulation, increasing the manufacturing accuracy of the protection layer.

12 Claims, 4 Drawing Sheets

(51) Int. Cl.
    *H01L 23/31*       (2006.01)
    *H01L 23/498*    (2006.01)
    *H01L 23/00*      (2006.01)

(52) U.S. Cl.
    CPC .......... *H01L 23/498* (2013.01); *H01L 23/562* (2013.01); *H01L 2224/04105* (2013.01); *H01L 2224/12105* (2013.01); *H01L 2224/32225* (2013.01); *H01L 2224/48227* (2013.01); *H01L 2224/73267* (2013.01)

(56) References Cited

OTHER PUBLICATIONS

Written Opinion of the International Search Authority for PCT /CN2016/108039, dated Mar. 15, 2017, and its English translation from Google.com Microsoft Translator.

* cited by examiner

SENSOR PACKAGING STRUCTURE AND MANUFACTURING METHOD THEREOF

CROSS-REFERENCE TO RELATED APPLICATIONS

This application is the U.S. national phase of PCT Application PCT/CN2016/108039 filed on Nov. 30, 2016 which claims the priority to the Chinese Patent Application No. 201510885822.7 filed on Dec. 04, 2015, the disclosures of which are incorporated herein by reference in their entireties.

TECHNICAL FIELD

The present invention relates to the field of manufacturing and packaging technology of sensor packaging structures.

BACKGROUND

The sensor's functional circuit (sensing surface) may face harsh operating environments and require an excellent protection layer to achieve structural protection, chemical protection, and electrostatic protection.

The common packaging structure in the prior art is a plastic packaging structure, including a substrate, a chip, and a filling portion. The functional circuit of the chip is located on the side of the chip away from the substrate. The functional circuit is electrically connected to the pad through the bonding wire and the internal wiring of the substrate. The filling portion wraps the whole chip. The functional circuit of the chip relies on the filling portion of the surface as a protection layer to provide protection. Because the protection layer is made of plastics with low hardness, using this packaging technology for sensor chip packaging cannot effectively protect the functional circuit of the sensor chip.

In the manufacturing technology of the sensor packaging structure, the tolerance depends on the assembly sequence. As the process proceeds, the accuracy will become lower due to tolerance accumulation. In the manufacturing process of the existing packaging structure, the side of the chip away from the functional circuit is attached to the substrate, and then the chip and the substrate are placed in an injection molding machine for injection of the filling portion. Since the filling portion serving as the protection layer is manufactured at last, the tolerances of the substrate and the chip will accumulate on the protection layer, resulting in a low manufacturing accuracy of the protection layer.

At present, there is neither a structure applied to sensor packaging nor a manufacturing method thereof, which can effectively protect the functional circuit of the sensor and maintain high manufacturing accuracy of the protection layer.

SUMMARY

An object of the present invention is to provide a packaging structure with a high manufacturing accuracy, which can better protect a functional circuit surface of a sensor chip, and a manufacturing method thereof:

To achieve the above-mentioned invention object, the present invention adopts the following technical solutions:

A sensor packaging structure comprises a protection board, a circuit structure and a filling structure, wherein a front surface of the circuit structure is connected to a first surface of the protection board, a second surface of the protection board is used as a sensing function surface, and the filling structure is located on the outer periphery of the circuit structure and connected to the first surface of the protection board.

Further, the filling structure and the protection board form an accommodating space with an opening on one side, the circuit structure is located in the accommodating space, and the back surface of the circuit structure is exposed at the opening of the accommodating space.

As a further improved technical solution of the present invention, the circuit structure comprises a chip and a substrate, and the chip is connected back-to-back to the substrate; a front surface of the chip is located on the front surface of the circuit structure and is provided with a functional circuit; and a front surface of the substrate is located on a back surface of the circuit structure and is provided with a pad.

As a further technical solution of the present invention, the functional circuit on the front surface of the chip is electrically connected to the pad on the back surface of the substrate.

As a further improved technical solution of the present invention, the size and shape of the substrate conform to the size and shape of the chip.

As a further improved technical solution of the present invention, the size and shape of the substrate do not conform to the size and shape of the chip.

A method for manufacturing a sensor packaging structure includes the sequential steps of:

S1, bonding a chip to a substrate back-to-back, and electrically connecting a functional circuit disposed on a front surface of the chip and a pad disposed on a front surface of the substrate to obtain a circuit structure;

S2, bonding the front surface(s) of one or more circuit structures to a first surface of a protection board;

S3, forming a filling structure by injection molding along the outer periphery of the circuit structure, the filling structure being bonded to the first surface of the protection board; and S4, dividing the filling structure and the protection board in units of the circuit structure.

As a further improved technical solution of the present invention, in step S1, the back surface of the substrate and the back surface of the chip are bonded by a paste method.

As a further improved technical solution of the present invention, in step S1, the substrate is directly grown on the back surface of the chip by an additive method.

Compared with the prior art, the technical effect of the present invention lies in the followings.

The sensor packaging structure of the present invention uses the protection board as a protection layer of the functional circuit, which can effectively protect the functional circuit of the sensor. Meanwhile, the procedure of connecting the protection board and the circuit structure in advance in the manufacturing method can avoid tolerance accumulation and maintain high manufacturing accuracy.

DETAILED DESCRIPTION

The present invention will be described in detail below with reference to specific embodiments shown in the accompanying drawings. However, these embodiments do not limit the present invention, and structural, methodological, or functional changes made by those skilled in the art based on these embodiments are all included in the scope of the present invention.

In the present invention, a back surface of a chip is defined as the side of the chip that contacts a substrate after the bonding of the chip and the substrate. A front surface of the chip is defined as the side of the chip opposite to the back surface of the chip after the bonding of the chip and the substrate. A back surface of the substrate is defined as the side of the substrate that is in contact with the chip after the bonding of the chip and the substrate. A front surface of the substrate is defined as the side of the substrate opposite to the back surface of the substrate after the bonding of the chip and the substrate.

The same or similar structures in the respective embodiments are given the same reference numerals.

Embodiment 1

Figure 1:
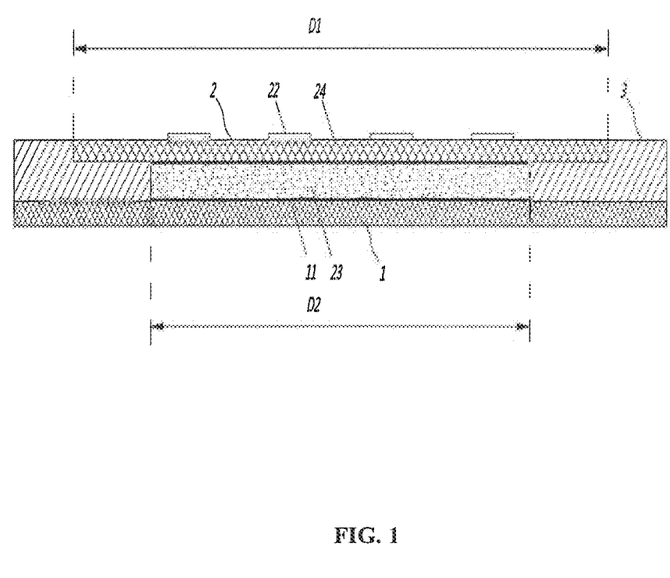
FIG. 1 is a cross-sectional view of a sensor packaging structure according to a first embodiment of the present invention.

Referring to FIG. 1, the present invention provides a sensor packaging structure. The sensor packaging structure includes a protection board 1, a circuit structure 2, and a filling structure 3. A front surface of the circuit structure 2 is connected to a first surface of the protection board 1. A second surface of the protection board 1 (the other side of the protection board parallel to the first surface) is used as a sensing function surface. The filling structure 3 is located on the outer periphery of the circuit structure 2 and connected to the first surface of the protection board 1. The filling structure 3 and the protection board 1 form an accommodating space with an opening on one side. The circuit structure 2 is located in the accommodating space. A back surface of the circuit structure 2 is exposed at the opening of the accommodating space.

The circuit structure 2 includes a chip 23 and a substrate 24. The chip 23 is connected back-to-back to the substrate 24. A front surface of the chip 23 is located at the front surface of the circuit structure and is provided with a functional circuit 11. A front surface of the substrate 24 is located at the back surface of the circuit structure 2 and is provided with a pad 22. The pad 22 is electrically connected to the functional circuit 11 on the front surface of the chip 23.

Generally, in the prior art, the protection board 1 is made of a hard and bright material such as glass, sapphire, crystal, ceramics or the like. The functional circuit 11 provided on the front surface of the chip 23 uses the protection board 1 as a protection layer. The protection board 1 provides reliable protection for the functional circuit.

In the present embodiment, the sectional width D1 of the substrate 24 is greater than the sectional width D2 of the chip 23.

Further, a back surface of the substrate 24 may be connected to a back surface of the chip 23 by direct bonding and the substrate 24 may also be directly grown on the back surface of the chip 23 by an additive method.

Figure 4:
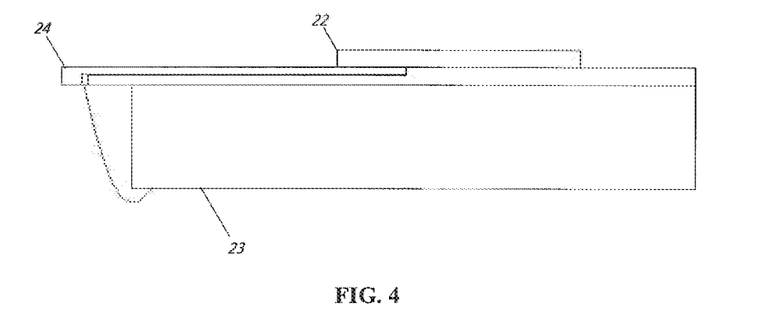
FIG. 4 is a first schematic diagram of the electrical connection mode between the functional circuit and the pad in the present invention.

Referring to FIG. 4, the functional circuit 11 on the front surface of the chip 23 and the pad 22 disposed on the front surface of the substrate 24 may be electrically connected by a wire bonding method (the wire bonding method belongs to prior art).

Figure 5:
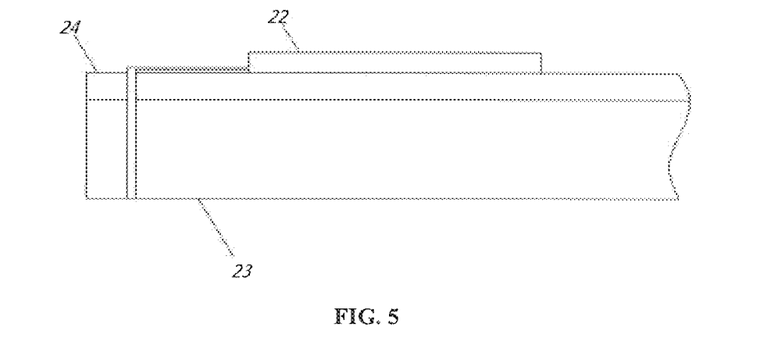
FIG. 5 is a second schematic diagram of the electrical connection mode between the functional circuit and the pad in the present invention.

Referring to FIG. 5, the functional circuit 11 on the front surface of the chip 23 and the pad 22 disposed on the front surface of the substrate 24 may also be electrically connected through a through-silicon via method (the through-silicon via method belongs to prior art).

It should be noted here that the electrical connection between the pad 22 and the functional circuit 11 on the front surface of the chip 23 is not limited to the above-listed two modes. For example, the BOA (Ball Grid Array) mode or prior arts such as a combination of various methods which can realize the electrical connection between the pad 22 and the functional circuit 11 on the front surface of the chip 23 should be included.

Figure 6:
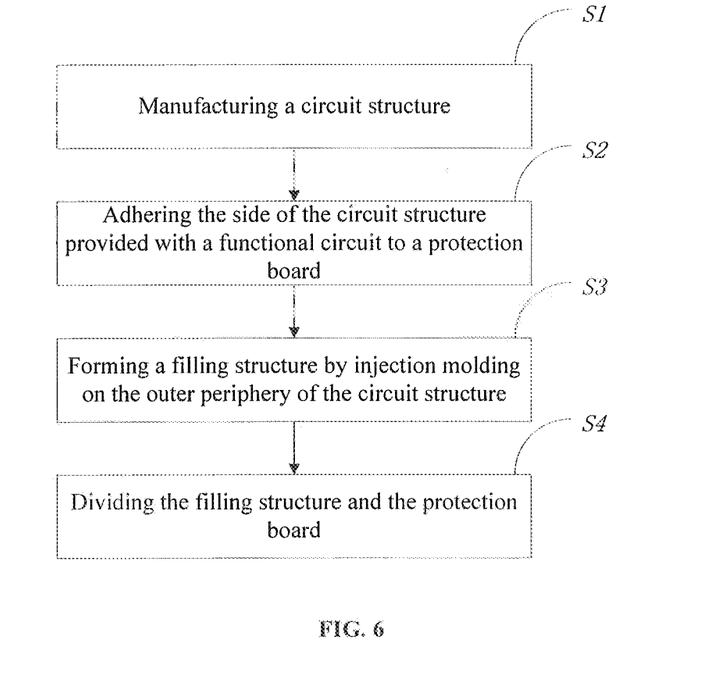
FIG. 6 is a schematic flow chart of a method for manufacturing a sensor packaging structure according to the present invention.

Referring to FIG. 6, the present invention also provides a method for manufacturing a sensor packaging structure, which includes the following steps successively.

In step S1, a chip is bonded to a substrate back-to-back, and a functional circuit disposed on a front surface of the chip is electrically connected to a pad disposed on a front surface of the substrate to obtain a circuit structure.

In step S2, the front surface(s) of one or more circuit structures are bonded to a first surface of a protection board.

In step S3, a filling structure is formed by injection molding along the outer periphery of the circuit structure, and the filling structure is bonded to the first surface of the protection board.

In step S4, the filling structure and the protection board are divided in units of the circuit structure.

Figure 7:
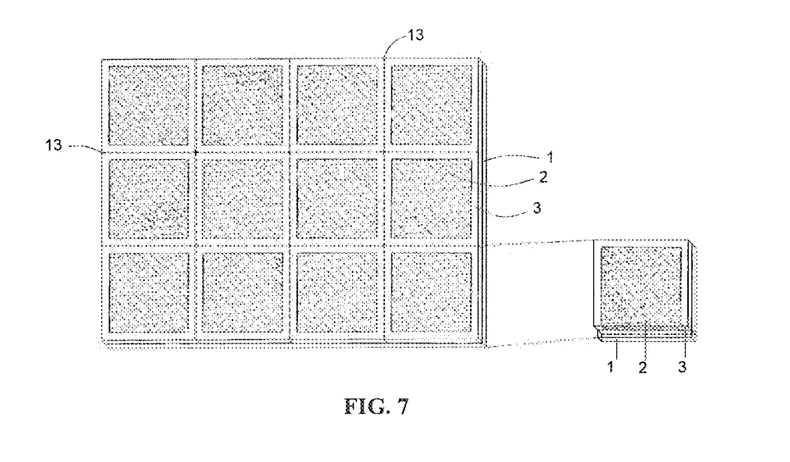
FIG. 7 is a schematic diagram of a method for manufacturing a sensor packaging structure according to the present invention.

Referring to FIG. 7, after affixing the front surfaces of a plurality of circuit structures 2 on the first surface of the protection board 1, the filling structure 3 is injection-molded along the outer periphery of the circuit structure 2. The filling structure 3 is bonded to the first surface of the protection board 1. Finally, the filling structure 2 and the protection board 1 are divided along a dividing line 13 in units of the circuit structure 2. Here, the chip 23 and the substrate 24 of the circuit structure 2 are connected. The pad 22 and the functional circuit 11 on the front surface of the chip are electrically connected.

Further, specifically, in step S1, a back surface of the substrate 24 is connected to a back surface of the chip 23 by direct bonding, and the back surface of the substrate 24 may also be directly grown on the back surface of the chip 23 by an additive method.

Referring to FIG. 4, the functional circuit 11 on the front surface of the chip 23 and the pad 22 disposed on the front surface of the substrate 24 may be electrically connected by a wire bonding method (the wire bonding method belongs to prior art).

Referring to FIG. 5, the functional circuit 11 on the front surface of the chip 23 and the pad 22 disposed on the front surface of the substrate 24 may also be electrically connected through a through-silicon via method (the through-silicon via method belongs to prior art).

It should be noted here that the electrical connection between the pad 22 and the functional circuit 11 on the front surface of the chip 23 is not limited to the above-listed two modes. For example, the BGA (Ball Grid Array) mode or prior arts such as a combination of various methods which can realize the electrical connection between the pad 22 and the functional circuit 11 on the front surface of the chip 23 should be included.

The sensor packaging structure of the present invention uses the protection board as a protection layer of the functional circuit, which can effectively protect the functional circuit of the sensor. Meanwhile, the procedure of connecting the protection board serving as the protection layer of the functional circuit to the circuit structure in the manufacturing method is performed in advance, which can avoid tolerance accumulation and maintain high manufacturing accuracy.

Embodiment 2

Figure 2:
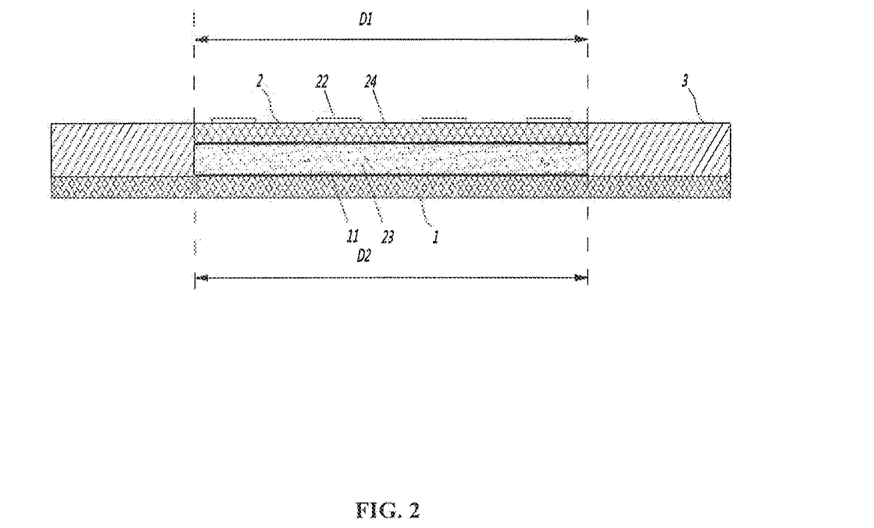
FIG. 2 is a cross-sectional view of a sensor packaging structure according to a second embodiment of the present invention.

Referring to FIG. 2, the present invention provides a sensor packaging structure. The sensor packaging structure includes a protection board 1, a circuit structure 2 and a filling structure 3. A front surface of the circuit structure 2 is connected to a first surface of the protection board 1. A second surface of the protection board 1 (the other side of the protection board parallel to the first surface) is used as a sensing function surface. The filling structure 3 is located on the outer periphery of the circuit structure 2 and connected to the first surface of the protection board 1. The filling structure 3 and the protection board 1 form an accommodating space with an opening on one side. The circuit structure 2 is located in the accommodating space. A back surface of the circuit structure 2 is exposed at the opening of the accommodating space.

The circuit structure 2 includes a chip 23 and a substrate 24. The chip 23 is connected back-to-back to the substrate 24. A front surface of the chip 23 is located on the front surface of the circuit structure 2 and is provided with a functional circuit 11. A front surface of the substrate 24 is located on the back surface of the circuit structure 2 and is provided with a pad 22. The pad 22 is electrically connected to the functional circuit 11 of the chip 23.

Generally, in the prior art, the protection board 1 is made of a hard and bright material such as glass, sapphire, crystal, ceramics or the like. The functional circuit 11 provided on the front surface of the chip 23 uses the protection board 1 as a protection layer. The protection board 1 provides reliable protection for the functional circuit.

In the present embodiment, the sectional width D1 of the substrate 24 is equal to the sectional width D2 of the chip 23.

A back surface of the substrate 24 may be connected to the back surface of the chip 23 by direct bonding and may also be directly grown on the back surface of the chip 23 by an additive method.

Referring to FIG. 4, the functional circuit 11 on the front surface of the chip 23 and the pad 22 disposed on the front surface of the substrate 24 may be electrically connected by a wire bonding method (the wire bonding method belongs to prior art).

Referring to FIG. 5, the functional circuit 11 on the front surface of the chip 23 and the pad 22 disposed on the front surface of the substrate 24 may also be electrically connected through a through-silicon via method (the through-silicon via method belongs to prior art).

It should be noted here that the electrical connection between the pad 22 and the functional circuit 11 on the front surface of the chip 23 is not limited to the above-listed two modes. For example the BGA (Ball Grid Array) mode or prior arts such as a combination of various methods which can realize the electrical connection between the pad 22 and the front functional circuit 11 of the chip 23 should be included.

Referring to FIG. 6, the present invention also provides a method for manufacturing a sensor packaging structure, which includes the following steps successively.

In step S1, a chip is bonded to a substrate back-to-back, and a functional circuit disposed on a front surface of the chip is electrically connected to a pad disposed on a front surface of the substrate to obtain a circuit structure.

In step S2, the front surface(s) of one or more circuit structures are bonded to a first surface of a protection board.

In step S3, a filling structure is formed by injection molding along the outer periphery of the circuit structure, and the filling structure is bonded to the first surface of the protection board.

In step S4, the filling structure and the protection board are divided in units of the circuit structure.

Referring to FIG. 7, after affixing the front surfaces of a plurality of circuit structures 2 on the first surface of the protection board 1, the filling structure 3 is injection-molded along the outer periphery of the circuit structure 2, and the filling structure 3 is bonded to the first surface of the protection board 1. Finally, the filling structure 2 and the protection board 1 are divided along a dividing line 13 in units of the circuit structure 2. Here, the chip 23 and the substrate 24 of the circuit structure 2 are connected, and the pad 22 and the functional circuit 11 on the front surface of the chip are electrically connected.

Further, specifically, in step S1, a back surface of the substrate 24 is connected to a back surface of the chip 23 by direct bonding, and the back surface of the substrate 24 may also be directly grown on the back surface of the chip 23 by an additive method.

Referring to FIG. 4, the functional circuit 11 on the front surface of the chip 23 and the pad 22 disposed on the front surface of the substrate 24 may be electrically connected by a wire bonding method (the wire bonding method belongs to prior art).

Referring to FIG. 5, the functional circuit 11 on the front surface of the chip 23 and the pad 22 disposed on the front surface of the substrate 24 may also be electrically connected through a through-silicon via method (the through silicon via method belongs to prior art).

It should be noted here that the electrical connection between the pad 22 and the functional circuit 11 on the front surface of the chip 23 is not limited to the above-listed two modes. For example, the BGA (Ball Grid Array) mode, or prior arts such as a combination of various methods which can realize the electrical connection between the pad 22 and the front functional circuit 11 of the chip 23 should be included.

The sensor packaging structure of the present invention uses the protection board as a protection layer of the functional circuit, which can effectively protect the functional circuit of the sensor. Meanwhile, the procedure of connecting the protection board serving as a functional circuit protection layer to the circuit structure in the manufacturing method is performed in advance, which can avoid tolerance accumulation and maintain high manufacturing accuracy.

Embodiment 3

Figure 3:
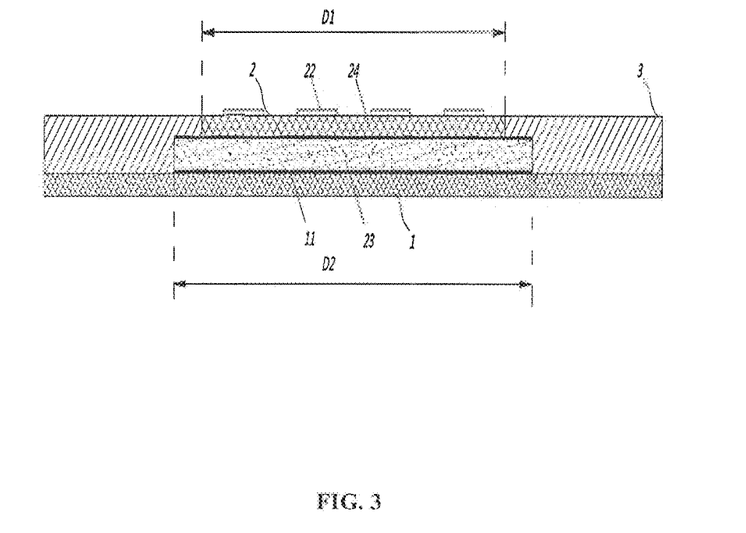
FIG. 3 is a cross-sectional view of a sensor packaging structure according to a third embodiment of the present invention.

Referring to FIG. 3, the present invention provides a sensor packaging structure. The sensor packaging structure includes a protection board 1, a circuit structure 2, and a filling structure 3. A front surface of the circuit structure 2 is connected to a first surface of the protection board 1. A second surface of the protection board 1 (the other side of the protection board parallel to the first surface) is used as a sensing function surface. The filling structure 3 is located at the outer periphery of the circuit structure 2 and connected to the first surface of the protection board 1. The filling structure 3 and the protection board 1 constitute an accommodating space with an opening on one side. The circuit structure 2 is located in the accommodating space. A back surface of the circuit structure 2 is exposed at the opening of the accommodating space.

The circuit structure 2 includes a chip 23 and a substrate 24. The chip 23 is connected back-to-back to the substrate 24. A front surface of the chip 23 is located on the front surface of the circuit structure and is provided with a functional circuit 11, A front surface of the substrate 24 is located on the back surface of the circuit structure 2 and is provided with, a pad. The pad 22 is electrically connected to the functional circuit 11 of the chip 23.

Generally, in the prior art, the protection board 1 is made of a hard and bright material such as glass, sapphire, crystal, ceramics or the like. The functional circuit 11 provided on the front surface of the chip 23 uses the protection board 1 as a protection layer. The protection board 1 provides reliable protection for the functional circuit.

In the present embodiment, the sectional width D1 of the substrate 24 is smaller than the sectional width D2 of the chip 23.

A back surface of the substrate 24 may be connected to a back surface of the chip 23 by direct bonding and may also be directly grown on the back surface of the chip 23 by an additive method.

Referring to FIG. 4, the functional circuit 11 on the front surface of the chip 23 and the pad 22 disposed on the front surface of the substrate 24 may be electrically connected by a wire bonding method (the wire bonding method belongs to prior art).

Referring to FIG. 5, the functional circuit 11 on the front surface of the chip 23 and the pad 22 disposed on the front surface of the substrate 24 may also be electrically connected through a through-silicon via method (the through-silicon via method belongs to prior art).

It should be noted here that the electrical connection between the pad 22 and the functional circuit 11 on the front surface of the chip 23 is not limited to the above-listed two modes. For example, the BGA (Ball Grid Array) mode or prior arts such as a combination of various methods which can realize the electrical connection between the pad 22 and the front functional circuit 11 of the chip 23 should be included.

Referring to FIG. 6, the present invention also provides a method for manufacturing a sensor packaging structure, which includes the following steps successively.

In step S1, a chip is bonded to a substrate back-to-back, and a functional circuit disposed on a front surface of the chip is electrically connected to a pad disposed on a front surface of the substrate to obtain a circuit structure.

In step S2, the front surface(s) of one or more circuit structures are bonded to a first surface of a protection board.

In step S3, a filling structure is formed by injection molding along the outer periphery of the circuit structure, and the filling structure is bonded to the first surface of the protection board.

In step S4, the filling structure and the protection board are dived in units of the circuit structure.

Referring to FIG. 7, after affixing the front surfaces of a plurality of circuit structures 2 on the first surface of the protection board 1, the filling structure 3 is injection-molded along the outer periphery of the circuit structure 2, and the filling structure 3 is bonded to the first surface of the protection board 1. Finally, the filling structure 2 and the protection board 1 are divided along a dividing line 13 in units of the circuit structure 2. Here, the chip 23 and the substrate 24 of the circuit structure 2 are connected, and the pad 22 and the functional circuit 11 on the front surface of the chip are electrically connected.

Further, specifically, in step S1, a back surface of the substrate 24 is connected to a back surface of the chip 23 by direct bonding, and the back surface of the substrate 24 may also be directly grown on the back surface of the chip 23 by an additive method.

Referring to FIG. 4, the functional circuit 11 on the front surface of the chip 23 and the pad 22 disposed on the front surface of the substrate 24 may be electrically connected by a wire bonding method (the wire bonding, method belongs to prior art).

Referring to FIG. 5, the functional circuit 11 on the front surface of the chip 23 and the pad 22 disposed on the front surface of the substrate 24 may also be electrically connected through a through-silicon via method (the through-silicon via method belongs to prior art).

It should be noted here that the electrical connection between the pad 22 and the functional circuit 11 on the front surface of the chip 23 is not limited to the above-listed two modes. For example, the BOA (Ball Grid Array) mode or prior arts such as a combination of various methods which can realize the electrical connection between the pad 22 and the front functional circuit 11 of the chip 23 should be included.

The sensor packaging structure of the present invention uses the protection board as a protection layer of the functional circuit, which can effectively protect the functional circuit of the sensor. Meanwhile, the procedure of connecting the protection board serving as a functional circuit protection layer to the circuit structure in the manufacturing method is performed in advance, which can avoid tolerance accumulation and maintain high manufacturing accuracy.

For a person skilled in the art, it is apparent that the present invention is not limited to the details of the above exemplary embodiments, and the present invention can be implemented in other specific forms without departing from the spirit or essential characteristics of the present invention. Therefore, the embodiments should be regarded as exemplarily and not restrictive, and the scope of the present invention is defined by the appended claims rather than the above description. Therefore, it is intended that all changes falling within the meaning and scope of equivalency of the claims are encompassed by the present invention. Any reference signs in the claims should not be regarded as limiting the involved claims.

In addition, it should be understood that although the present specification is described in terms of embodiments, not every embodiment includes only a single technical solution. Such a narration of the specification is merely for the sake of clarity, and those skilled in the art should consider the specification as a whole. The technical solutions in the embodiments can also be combined as appropriate to form other embodiments that can be understood by those skilled in the art.

What is claimed is:

1. A sensor packaging structure, comprising a protection board, a circuit structure and a filling structure, wherein a front surface of the circuit structure is connected to a first surface of the protection board, and a second surface of the protection board is used as a sensing function surface;
the filling structure is formed on an outer periphery of the circuit structure and connected to the first surface of the protection board, forming an accommodating space to enclose the circuit structure;
the circuit structure includes a chip and a substrate, and the chip is connected back-to-back to the substrate;
a front surface of the chip is located on the front surface of the circuit structure and is provided with a functional circuit; and
a front surface of the substrate is located on a back surface of the circuit structure and is provided with a pad,
wherein the protection board comprises a first part and a second part arranged around the first part, the first part is used for carrying the circuit structure, and the filling structure is connected to the second part; and
wherein the filling structure and the first part are separated from each other.

2. The sensor packaging structure according to claim 1, wherein the filling structure and the protection board form the accommodating space with an opening on one side, the circuit structure is located in the accommodating space, and the back surface of the circuit structure is exposed at the opening of the accommodating space.

3. The sensor packaging structure according to claim 1, wherein the filling structure is disposed around the circuit structure.

4. The sensor packaging structure according to claim 3, wherein the filling structure is disposed around both the substrate and the chip.

5. The sensor packaging structure according to claim 1, wherein the filling structure is disposed on a side of the protection board away from the second surface of the protection board.

6. The sensor packaging structure according to claim 1, wherein the functional circuit and the first surface of the protection board are in contact with each other.

7. The sensor packaging structure according to claim 1, wherein the protection board is a wafer protection board, and the substrate is an independent substrate, and the wafer protection board is configured to carry the circuit structure before a plurality of circuit structures are divided.

8. The sensor packaging structure according to claim 1, wherein the functional circuit is electrically connected to the pad.

9. The sensor packaging structure according to claim 1, wherein a size and a shape of the substrate conform to a size and a shape of the chip.

10. The sensor packaging structure according to claim 1, wherein a peripheral region of the filling structure is flush with a peripheral region of the protection board.

11. The sensor packaging structure according to claim 1, wherein a contact portion is formed between the functional circuit and the protection board, and the filling structure is arranged around the contact portion.

12. The sensor packaging structure according to claim 1, wherein the functional circuit on the front surface of the chip and the pad disposed on the front surface of the substrate are electrically connected by a wire bonding method, or through a through-silicon via method, or by a ball grid array mode.

* * * * *